United States Patent
Carpenter et al.

(10) Patent No.: US 7,620,510 B2
(45) Date of Patent: Nov. 17, 2009

(54) PULSED RING OSCILLATOR CIRCUIT FOR STORAGE CELL READ TIMING EVALUATION

(75) Inventors: Gary D. Carpenter, Austin, TX (US); Jente B Kuang, Austin, TX (US); Kevin J. Nowka, Georgetown, TX (US); Liang-Teck Pang, Albany, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/128,526

(22) Filed: May 28, 2008

(65) Prior Publication Data

US 2008/0225615 A1    Sep. 18, 2008

Related U.S. Application Data

(63) Continuation of application No. 11/682,542, filed on Mar. 6, 2007, now Pat. No. 7,409,305.

(51) Int. Cl.
*G06F 3/00*    (2006.01)
(52) U.S. Cl. .......................... 702/75; 702/74; 702/182; 702/183
(58) Field of Classification Search ................... 702/74, 702/75, 79, 106, 107, 118, 182, 183, 188; 365/154, 189.011, 230.06; 331/1; 438/200; 257/298
See application file for complete search history.

(56) References Cited

U.S. PATENT DOCUMENTS

| | | | |
|---|---|---|---|
| 5,781,469 A | 7/1998 | Pathak et al. | |
| 5,870,404 A | 2/1999 | Ferraiolo et al. | |
| 6,452,459 B1 | 9/2002 | Chan et al. | |
| 6,538,522 B1 | 3/2003 | Aipperspach et al. | |

(Continued)

FOREIGN PATENT DOCUMENTS

JP    09294055 A    11/1997

(Continued)

OTHER PUBLICATIONS

U.S. Appl. No. 11/609,598, filed Dec. 12, 2006, Ehrenreich, et al.

(Continued)

*Primary Examiner*—Eliseo Ramos Feliciano
*Assistant Examiner*—Felix E Suarez
(74) *Attorney, Agent, or Firm*—Mitch Harris, Atty at Law, LLC; Andrew M. Harris; Libby Z. Handelsman (57) ABSTRACT

A pulsed ring oscillator circuit for storage cell read timing evaluation provides read strength information. A pulse generator is coupled to a bitline to which the storage cell to be measured is connected. The storage cell thereby forms part of the ring oscillator and the read strength of the storage cell is reflected in the frequency of oscillation. A pulse regeneration circuit is included in the ring so that the storage cell read loading does not cause the oscillation to decay. Alternatively, a counter may be used to count the number of oscillations until the oscillations decay, which also yields a measure of the read strength of the storage cell. The pulse generator may have variable output current, and the current varied to determine a change in current with the storage cell enabled and disabled that produces the same oscillation frequency. The read current is the difference between currents.

20 Claims, 5 Drawing Sheets

U.S. PATENT DOCUMENTS

| | | | |
|---|---|---|---|
| 6,909,301 B2 | 6/2005 | Korson et al. | |
| 7,046,094 B2 | 5/2006 | Belluomini et al. | |
| 7,173,875 B2 * | 2/2007 | Chan et al. | 365/230.06 |
| 7,250,821 B2 | 7/2007 | Momii et al. | |
| 7,304,895 B2 * | 12/2007 | Joshi et al. | 365/189.011 |
| 7,376,001 B2 * | 5/2008 | Joshi et al. | 365/154 |
| 2002/0135343 A1 | 9/2002 | Underbrink et al. | |
| 2004/0061561 A1 | 4/2004 | Monzel et al. | |
| 2005/0063232 A1 | 3/2005 | Chan et al. | |
| 2005/0204211 A1 | 9/2005 | Gouin et al. | |
| 2006/0050600 A1 | 3/2006 | Venkatraman et al. | |
| 2006/0097802 A1 | 5/2006 | Chan et al. | |
| 2007/0058448 A1 * | 3/2007 | Joshi et al. | 365/189.01 |
| 2007/0086232 A1 * | 4/2007 | Joshi et al. | 365/154 |

OTHER PUBLICATIONS

U.S. Appl. No. 11/250,061, filed Oct. 13, 2005, Kuang, et al.
U.S. Appl. No. 11/260,571, filed Oct. 27, 2005, Chuang, et al.
U.S. Appl. No. 11/559,436, filed Nov. 14, 2006, Carpenter, et al.
U.S. Appl. No. 11/225,652, filed Sep. 13, 2005, Joshi, et al.
U.S. Appl. No. 11/781,994, filed Jul. 24, 2007, Kuang, et al.

* cited by examiner

PULSED RING OSCILLATOR CIRCUIT FOR STORAGE CELL READ TIMING EVALUATION

This application is a Continuation of U.S. patent application Ser. No. 11/682,542 filed on Mar. 6, 2007, now U.S. Pat. No. 7,409,305, by the same Inventors.

BACKGROUND OF THE INVENTION

1. Technical Field

The present invention relates generally to memory design evaluation circuits, and more particularly to a memory circuit having an oscillator circuit that has a frequency that accurately reflects internal read timing of a memory cell.

2. Description of the Related Art

Storage cell speed, circuit area and environmental operating ranges, e.g., supply voltage and temperature range, are critical limitations in today's processing systems and are predicted to become even more of a critical limitation as technologies move forward. In particular, static random access memory (SRAM) cells are used in processor caches and external storage to provide fast access to data and program instructions. Static storage cells are also used within processors and other digital circuits for storing values internally, for example, in processor registers.

With processor cycle frequencies reaching well above 4 Ghz, development of SRAM cells that can store and provide access to stored values within that period has become necessary. However, actually measuring the internal read timing of memory cells presents a challenge. In a typical storage cell, there is no mechanism for determining read timing of the cell itself, only the total delay including the wordline access and bitline read circuits. Probing the storage cell affects the operation of the storage circuit and therefore the results of any evaluation based on probing the cell. Test circuits can be built that simulate the operation of a storage cell for the purposes of cell read timing measurement, but are typically not integrated within the actual environment of a cell in a storage array, including bitline and wordline loading effects.

Memory cell timing for a combination of read and write delays has been evaluated using ring oscillator circuits or cascaded cell delay circuits wherein a large number of cells are cascaded. A ring oscillator may be formed with feedback of an output of the last cell to an input of the first cell, or a one-shot delay may be measured through the cascade of cells. The frequency at which the ring oscillator operates or the one-shot delay indicates the read/write cycle timing, which provides some measure of ultimate operating frequency and access times of the storage array. Typically, the cell design is then changed in subsequent design iterations having parameters adjusted in response to the results of the ring oscillator test.

However, the above-mentioned ring oscillator circuits and other delay-oriented circuits for performing delay tests do not provide an independent measure of read timing, since the inclusion of a cell in the oscillator ring or delay line requires that the cell values will be written in some manner to change the value in the next cell as a transition of the oscillation is propagated around the ring. Further, such circuits do not provide for measuring read current or read strength independent of the speed of a write operation.

It is therefore desirable to provide a test circuit and method for accurately measuring cell read timing independent of write timing under the load conditions of actual array. It is further desirable to provide a circuit and method that can measure read strength/read current directly. It is further desirable to provide such a test circuit that can be integrated within a production storage device.

SUMMARY OF THE INVENTION

The objective of accurately determining storage cell read timing and read strength/read current is accomplished in a method and circuit. The circuit is a ring oscillator that includes one or more storage cells, which can be a storage cell in an array that is selected by enabling a wordline. Variation of read timing along the array can be measured by enabling each wordline in turn, and taking measurements. A bitline connected to the selected storage cell is stimulated by a pulse generating circuit and the pulse generating circuit also has an input coupled to the bitline, so that a ring oscillator is formed and the current drawn by the storage cell read alters the operation and thus the frequency of the ring oscillator. The loading of the storage cell corresponds to the critical read timing, which is the time required for the cell to pull the bitline down from a pre-charged condition. By measuring the ring oscillator frequency with the wordline disabled and then enabled, the difference in oscillator period can be computed and is equal to the delay contribution due to the storage cell.

The pulse generator is triggered by a signal returned from the bitline, which is stretched by a pulse regenerator, so that pulse width reduction caused by the storage cell loading is overcome and oscillation is continually sustained. Alternatively, the pulse regenerator may be omitted and the oscillation can be permitted to decay as the oscillation frequency increases due to progressive shortening of the pulse. A counter is then used to determine the number of periods of oscillation, which provides a measure of the storage cell strength.

The pulse generator may have a variable current output that is controlled by a control voltage. By measuring the current at which the frequency with all of the wordlines disabled is equal to the frequency with a wordline enabled at another predetermined current level, the read current strength of the storage cell can be determined as the difference in the currents. Multiple word lines can be enabled in the array to measure an average storage cell strength.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a test circuit for evaluating read strength and read timing of static storage cells, e.g., registers or static memory cells, in order to facilitate design improvement and determination of read delay and read cycle timing margins. The read delay of a single storage cell is measured by generating a pulse on one of the bitlines connected to the storage cell, which is enabled by enabling the wordline of the row of the storage cell. The cell state is preset so that the bitline being pulsed is in a state opposite the bitline pre-charge state, and the other bitline may be strongly held in the pre-charged state, so that the storage cell does not change state. The difference between the ring oscillator frequency with the wordline enabled and the wordline disabled is substantially due to the additional storage cell read current, and therefore differences in frequency between storage cells under test provides a measure of read strength/read delay variation.

The pulse generator output may have a variable pull-down current provided to the bitline. The corresponding pull-up device serves as the precharge device. The frequency can be matched for the wordline-enabled versus wordline-disabled state by changing the current of the output driver. The change in current in the output driver provides a direct measure of the cell read current, which is also the measure of the read strength and determines the read strength. A current mirror may be used to provide for current measurement through a probe, so that the output driver current can be accurately measured. The output frequency of the ring oscillator increases when the wordline of the storage cell is enabled, since the fall time (pull-down) of the bitline is faster when the storage cell is enabled.

The circuit and methods described above provide an accurate measure of the read timing of the storage cells in an actual array implementation. Switches may be included to select the bitline under test and operated by a scan chain, so that each storage cell can be evaluated by a particular wordline/bitline combination. A production die may be implemented that includes the test circuit permanently wired-in-place and enabled in a test mode, or a sacrificial metal can be used to implement the circuit on a production wafer, which can then be modified into an operational circuit via a permanent metal layer that replaces the sacrificial layer.

Figure 1:
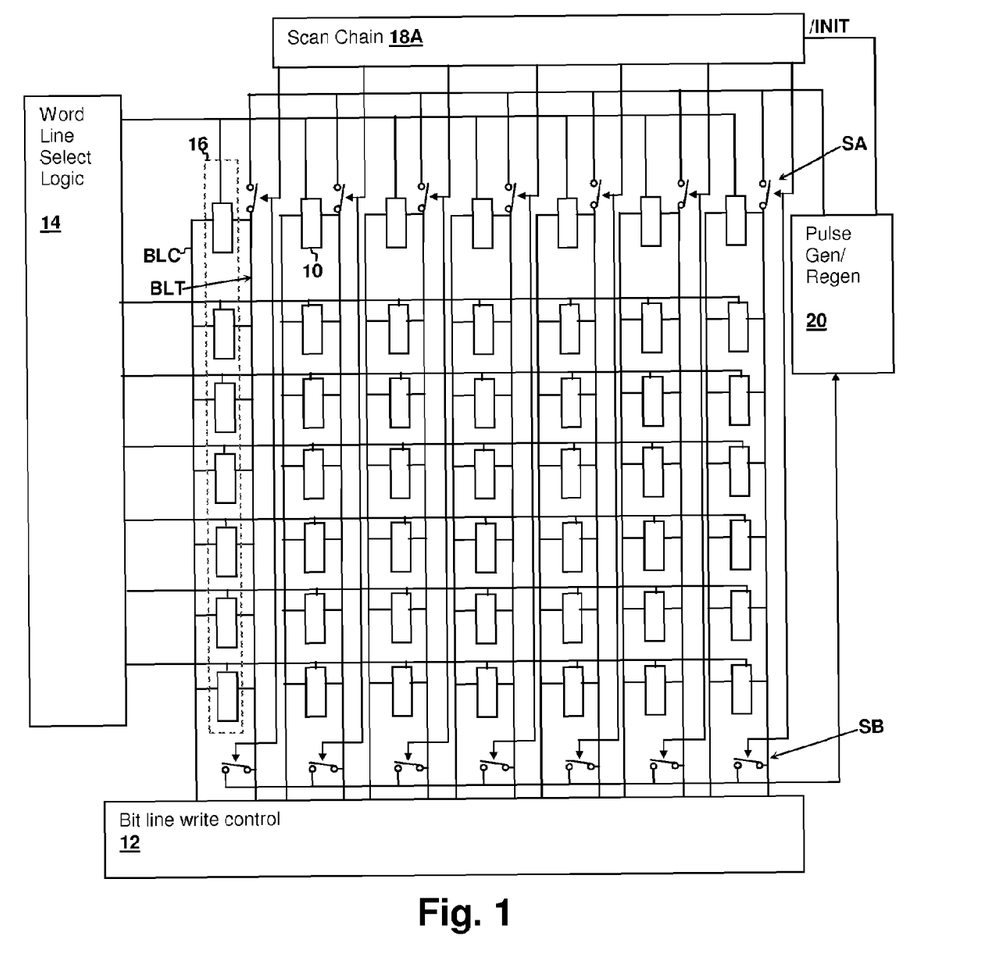
FIG. 1 is a schematic diagram of a test array in accordance with an embodiment of the invention.

With reference now to the figures, and in particular with reference to FIG. 1, a test storage array circuit in accordance with an embodiment of the invention is shown. An array of storage cells 10 comprising columns 16 is connected to a wordline select logic 14, which in normal operation generates wordline select signals, but under test scan chain control can be programmed to enable one or more wordlines to enable particular storage cells 10 on to bitlines BLT. A bitline write control circuit 12 provides the write input to the array under normal operating conditions, but in the test operation of the present invention is controlled by scanned-in values to hold bitlines BLC in the pre-charge condition, so that the values stored in storage cells 10 as reflected at bitlines BLT does not change during ring oscillator tests. Bitline write control circuit is disabled from bitlines BLT during ring oscillator operation. A set of switches SA selectively couple a bitline BLT to the output of a pulse generator/regeneration circuit 20 that forms a ring oscillator by receiving input from the same bitline selected by a set of switches SB, more than one bitline BLT can be optionally enabled, for averaging measurements as mentioned above for multiple wordline enabled tests. Switches SA and SB are controlled by another set of bits provided by a scan chain 18A. Scan chain 18A also provides an /INIT signal to pulse generator/regeneration circuit 20 to start the ring oscillator.

Figure 2:
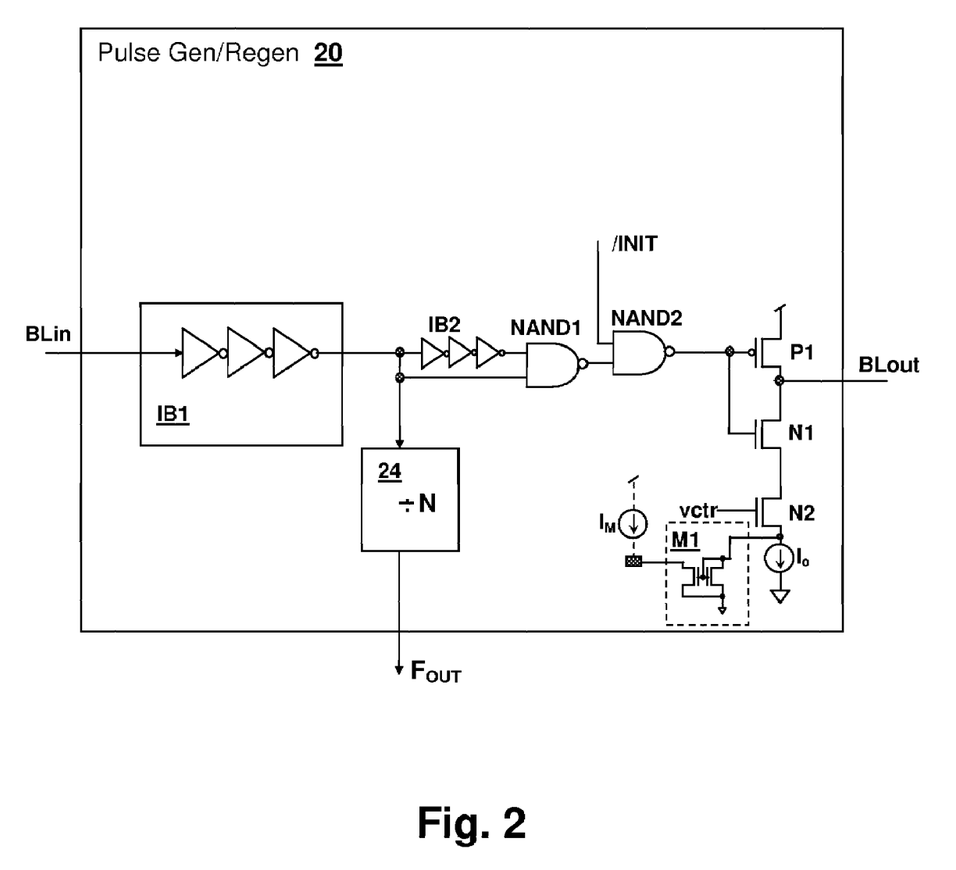
FIG. 2 is a schematic diagram depicting details of pulse generator/regenerator 20 of FIG. 1, in accordance with an embodiment of the invention.

Referring now to FIG. 2, details of pulse generator/regeneration circuit 20 of FIG. 1 is shown in accordance with an embodiment of the present invention. An input Blin receives a signal from a bitline BLT as selected by one of switches SB. An inverter bank IB1 of odd order both delays the signal and stretches the pulse to a width greater than the original pulse by virtue of special design techniques as will be described in further detail below. The output of inverter bank IB1 provides the input to a divider 24 that provides an output, generally via a probe pad, so that external frequency measurements can be performed by an external frequency counter. A second inverter bank IB2 of odd order and a logical-NAND gate NAND1 provide another circuit that restores the pulse to its original width, so that the ring oscillator frequency is constant and oscillation is sustained without decaying. If the pulse width is not restored, the shortening of pulse width due to the storage cell read loading will cause an increase in frequency until the oscillation stops by failing to trigger pulse generator 20.

A second logical-NAND gate controls the ring oscillator via the /INIT signal provided by scan chain 18. The pulse is applied to bitline BLT through one of switches SA by a transistor circuit that includes transistors P1, N1 and N2. Transistor P1 serves as the pre-charge circuit for bitline BLT and is sized appropriately. Transistors N1 and N2 divert the precharge current from storage cell 10 under test, but may be disabled, depending on the value of voltage vctr. As mentioned above, the value of voltage vctr may be adjusted to control the current of the output of pulse generator 20 when all of the wordlines are disabled. First, a frequency measurement is taken with the wordline of a selected storage cell 10 enabled to obtain a first frequency $F_o$. The current through transistors N1 and N2 can be set to zero for the bitline pull-down state by setting vctr=<0, alternatively the current through transistors N1 and N2 can be measured and subsequently taken into account. Then, the wordline is disabled and the current through transistors N1 and N2 is adjusted to obtain a ring oscillator frequency equal to $F_o$. The current through transistors N1 and N2 obtained above is the read current of the particular storage cell 10 enabled in the first frequency measurement, after subtracting any current through transistors N1 and N2 that was present during the initial measurement of frequency $F_o$ with the wordline enabled. Current $I_o$ may be computed from the characteristics of transistor N2 and voltage vctr, may be measured directly by providing $I_o$ from a test pad, or optionally determined from current $I_M$ of a current mirror M1, which is provided through a test pad. Alternatively, or in combination with the above measurement, frequency measurements can be made without changing the current through transistors N1 and N2. A first frequency $F_1$ is obtained with the wordline enabled and a second frequency $F_2$ is obtained with the wordline disabled. The difference between the periods $1/F_1 - 1/F_2$ provides a measure of the read delay and read strength.

Figure 3A:
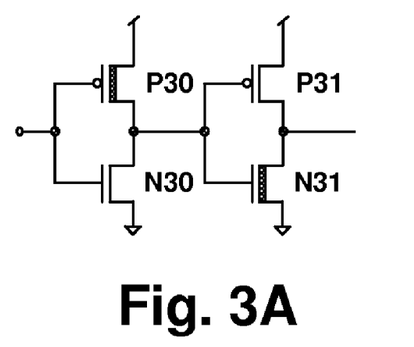
FIGS. 3A-3C are schematic diagrams depicting circuits for performing pulse stretching in pulse generator/regenerator 20 of FIG. 2.
Figure 3B:
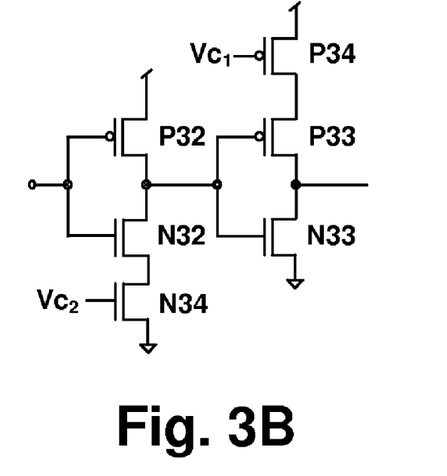
Figure 3C:
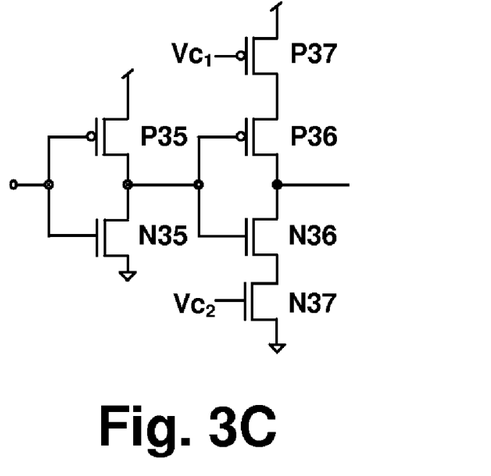

Referring now to FIGS. 3A-3C various pulse stretching inverter circuit embodiments are shown, as may be used in inverter banks IB1 and IB2 of FIG. 2. FIG. 3A shows two cascaded inverters formed by transistors P30,N30 and P31, N31, respectively. Transistor P30 is sized larger than transistor N30, which causes the fall time of the first inverter to be slower than the rise time, stretching the positive portion of an input pulse. Similarly Transistor N31 is sized larger than transistor P31, which causes the rise time of the second inverter to be slower than the fall time, stretching the negative portion of the output of the first inverter. The net result is a stretching of the positive portion of the input pulse. The depicted inverter is inserted in inverter bank IB1 after a first inverter of either normal design or strong-N design similar to the inverter formed by transistors P31 and N31, so that the signal provided at the gates of transistors P30 and N30 is the invert of the bitline BLT signal and therefore stretches the portion of the pulse corresponding to the non-precharge state in which storage cell 10 is pulling down bitline BLT.

FIG. 3B shows another inverter design having an asymmetric response that may be alternatively used in place of the circuit of FIG. 3A in inverter banks IB1 and IB2. Transistors N32,P32 and N33,P33 form two cascaded inverters as in FIG. 3A, but are similarly sized. Foot transistor N34 and header transistor P34 are biased by voltages $Vc_1$ and $Vc_2$ so that the fall time of the first inverter and the rise time of the second inverter are slowed as in the circuit of FIG. 3A, again causing stretching of the positive portion of a pulse provided to the gates of transistors N32 and P32. FIG. 3C shows another alternative pulse-stretching circuit that includes a standard inverter formed by transistors N35 and P35, followed by another inverter formed by transistors N36 and P36. Foot transistor N37 and header transistor P37 are biased by voltages $Vc_1$ and $Vc_2$ so that the fall time and rise time of the second inverter are both slowed as in the circuit of FIG. 3B, but in the circuit of FIG. 3C, causes stretching of both the positive and negative portion of a pulse provided to the gates of transistors N35 and P35. Asymmetrical stretching can then be controlled by adjusting voltages $Vc_1$ and $Vc_2$.

Figure 4:
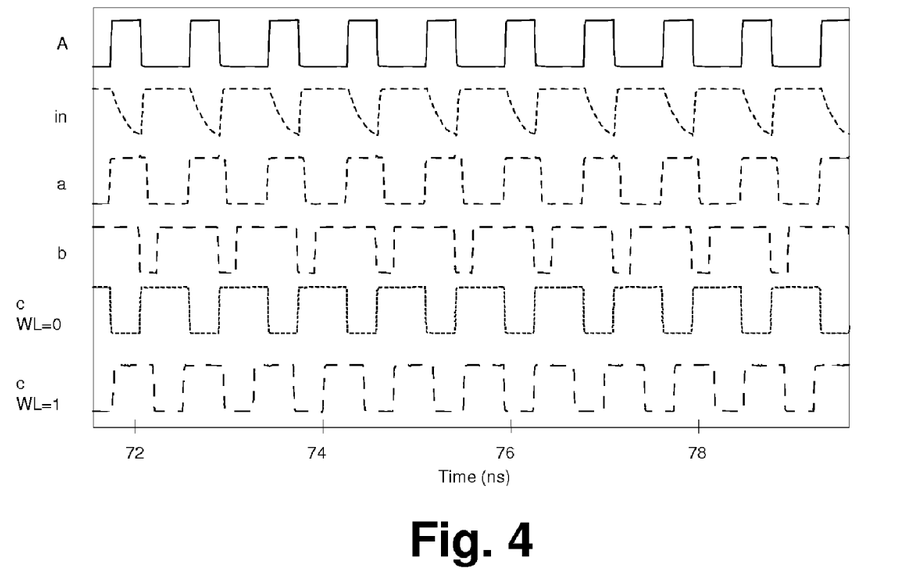
FIG. 4 is a signal diagram depicting signals in the test array of FIG. 1.

Referring now to FIG. 4, signals within the test array of FIG. 1 are depicted in a time-voltage diagram. Trace A corresponds to the output of logical NAND-gate NAND2 of pulse generator/regeneration circuit 20. Trace in shows the signal from bitline BLT at the input to pulse generator/regeneration circuit 20. Trace a shows the output of inverter bank IB1, which has stretched the positive portion of the signal at the input of pulse generator/regeneration circuit 20 until the width of the positive portion is greater than the original pulse from the output of logical NAND-gate NAND2 shown in trace A. Trace b shows the output of inverter bank IB2, which has stretched the negative portion of the negative portion and delayed the signal so that logical-NAND gate NAND1 generates the signal shown in trace C. Trace c is shown for the wordline enabled WL=1 condition (as shown in the other traces), as well as the WL=0 condition (not shown in the other traces). The frequency increase due to the additional read current when WL=1 can be seen from the waveforms.

Figure 5:
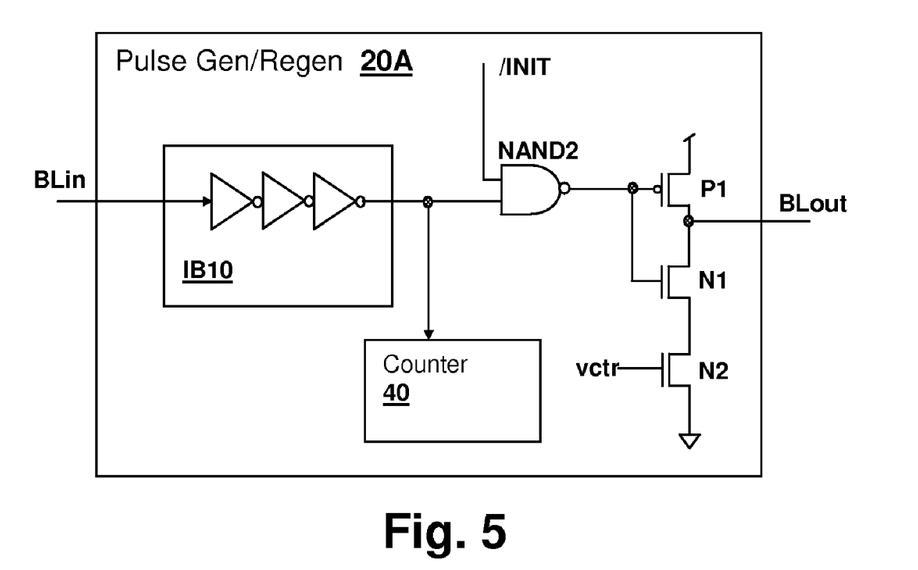
FIG. 5 is a schematic diagram depicting details of a pulse generator/regenerator 20A that may be used in the array FIG. 1, in accordance with another embodiment of the invention.

Referring now to FIG. 5, a pulse generator/regeneration circuit 20A is shown in accordance with an alternative embodiment of the present invention as may be used in the test array circuit of FIG. 1. In the depicted embodiment, asymmetric pulse stretching is not employed in inverter bank IB1 and the ring oscillator frequency is allowed to increase to the point where a counter 40 is no longer triggered, and oscillation will either cease or possibly continue at a very high frequency. The output count of counter 40 is proportional to the storage cell 10 read current and a wide /INIT pulse is desirable to maximize the resolution of the measurement. The balance of the circuit including logical-NAND gate NAND1 and transistors P1, N1 and N2 operate as described above with respect to pulse generator/regeneration circuit 20 of FIG. 2, and the circuit may also optionally include the current pad and/or current mirror circuit as described in the embodiment of FIG. 2.

Figure 6:
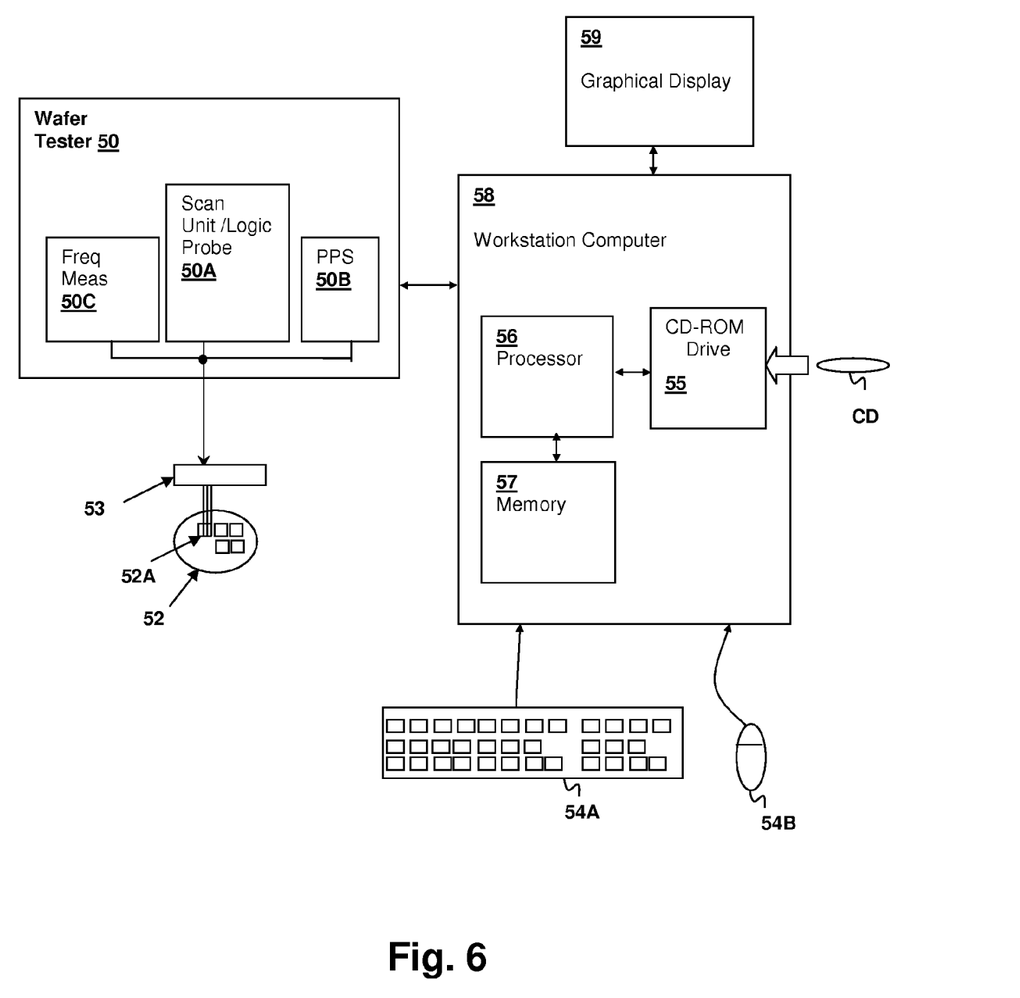
FIG. 6 is a wafer test system in which a method according to the present invention is practiced.

Referring now to FIG. 6, a VLSI wafer test system, in which methods according to an embodiment of the present invention are performed, is depicted. A wafer tester 50 includes a scan unit 50A for providing stimulus to and retrieving data from a die 52A on a wafer under test 52 via a probe head 53 having electrical test connections to die 52A. Wafer tester 50 includes a frequency measurement unit 50C that evaluates a frequency of the ring oscillator. Wafer tester 50 also includes a programmable power supply 50B for supplying control voltages $V_{c1}$ and $V_{c2}$ and optionally measuring current $I_o$ and/or voltage vctr supplied to the pulse generator output driver circuit so that the above-described frequency vs. current matching method described above can be performed during testing.

A workstation computer 58, having a processor 56 coupled to a memory 57, for executing program instructions from memory 57, wherein the program instructions include program instructions for receiving data from wafer tester 50 and/or circuits within wafer 52 in accordance with an embodiment of the present invention, is coupled to wafer tester 50. Generally the methods of the present invention control wordlines, select bitlines, generate the initialization pulse and count the frequency of oscillation of the ring oscillator. Counters may be included within the die circuits to count the frequency, or the frequency counters may be located in wafer tester 50. Program instructions obtain the counts from wafer tester 50 or read the counts from wafer 52, then process the counts to obtain the cell read delay. The program instructions may be loaded from a storage media such as optical disc CD via a CD-ROM drive 55 or other suitable optical or magnetic/non-volatile memory drive. The data produced by embodiments of the present invention are collected from multiple ring oscillator tests of storage cells 10 within dies 52A as control voltage or current is varied by programmable power supply 50B and different storage cells are selected by wordline/bitline switch combinations. The results of all of the measurements can then be evaluated to either change the design of the array or storage cells 10, determine whether fabrication process has deviated exceedingly from tolerable norms or to determine operational ranges such as power supply voltage tolerances and access cycle times.

Data from ring oscillator tests in accordance with embodiments of the invention are transferred to workstation computer 58 via wafer tester 50 and stored in memory 57 and/or other media storage such as a hard disk. Workstation computer 58 is also coupled to a graphical display 59 for displaying program output such as the results of memory tests described hereinafter. Workstation computer 58 is further coupled to input devices such as a mouse 54B and a keyboard 54A for receiving user input. Workstation computer 58 may be coupled to a public network such as the Internet, or may be a private network such as the various "intra-nets" and software containing program instructions for analyzing data produced by methods and circuits in accordance with embodiments of the present invention may be located on remote computers or locally within workstation computer 58. Further, workstation computer 58 may be coupled to wafer tester 50 by such a network connection.

While the system of FIG. 6 depicts a configuration suitable for sequential test of a plurality of dies on a wafer, the depicted system is illustrative and not limiting to the present invention. Probe head 53 may be a multi-die full wafer probe system, or may comprise multiple probe heads for simultaneously testing multiple wafers on a single or multiple die basis. Additionally, while scan chain retrieval and stimulus is illustrated, the techniques of the present invention may also be applied to other interfaces available to probe wafer 52, or applied to circuits implemented in fully functional dies where data extraction is performed over a serial or parallel bus or other interface.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A ring oscillator test circuit for determining a read strength of storage cells, comprising:
    a storage cell having an enable input and connected to a bitline, wherein said storage cell is read-enabled to said bitline when an enable signal applied to said enable input is asserted;
    a control circuit for providing said enable signal; and
    a pulse generator having an output coupled to said bitline and an input coupled to said bitline and having a net signal inversion from said input to said output, wherein said pulse generator forms a ring oscillator having a frequency of oscillation dependent on a state of said enable signal, whereby a read strength of said storage cell is observed in said frequency of oscillation when said enable signal is asserted.

2. The ring oscillator test circuit of claim 1, wherein said pulse generator further comprises a pulse regenerator that stretches a portion of a pulse received at said input of said pulse generator from said bitline, wherein said portion is a portion corresponding to a read of said storage cell, whereby said ring oscillator operates at a substantially constant frequency when said enable signal is asserted.

3. The ring oscillator test circuit of claim 1, wherein said ring oscillator operates at a dynamically increasing frequency when said enable signal is asserted.

4. The ring oscillator test circuit of claim 3, further comprising a counter for counting a number of cycles of said dynamically increasing frequency until said dynamically increasing frequency exceeds a threshold.

5. The ring oscillator circuit of claim 3, wherein said pulse generator further comprises an output stage for providing a pulse to said bitline, wherein said output stage, comprises:
    a pre-charge transistor for pre-charging said bitline according to a first state of said output of said pulse generator; and
    a discharge transistor having a controllable current for discharging said bitline according to a second state of said output of said pulse generator.

6. The ring oscillator circuit of claim 5, further comprising a foot transistor coupled in series with said discharge transistor, wherein a control voltage applied to a gate of said foot transistor controls said current.

7. The ring oscillator circuit of claim 5, further comprising a current mirror having an input branch coupled in series with said discharge transistor for providing an output branch for measuring a second current mirroring a value of said current.

8. The ring oscillator circuit of claim 5, wherein said discharge transistor has a current provided from a test pad, whereby said current is measured directly.

9. A test array, comprising:
    a plurality of storage cells arranged in rows and columns;
    a plurality of bitlines, wherein at least one bitline is connected to each of said columns of said storage cells; and
    a pulse generator having an output selectably coupled to said bitlines and an input selectably coupled to said bitlines and having a net signal inversion from said input to said output, wherein said pulse generator forms a ring oscillator having a frequency of oscillation dependent on a read current of a selected bitline, whereby a read strength of a storage cell is observed in said frequency of oscillation when a wordline connected to said storage cell is enabled.

10. The test array of claim 9, wherein said pulse generator further comprises a pulse regenerator that stretches a portion of a pulse received at said input of said pulse generator from a selected bitline, wherein said portion is a portion corresponding to a read of said storage cell, whereby said ring oscillator operates at a substantially constant frequency when said enable signal is asserted.

11. The test array of claim 9, wherein said ring oscillator operates at a dynamically increasing frequency when said enable signal is asserted, and further comprising a counter for counting a number of cycles of said dynamically increasing frequency until said dynamically increasing frequency exceeds a threshold.

12. The test array of claim 9, wherein said pulse generator further comprises an output stage for providing a pulse to a selected bitline, wherein said output stage, comprises:
    a pre-charge transistor for pre-charging said bitline according to a first state of said output of said pulse generator; and
    a discharge transistor having a controllable current for discharging said bitline according to a second state of said output of said pulse generator.

13. The test array of claim 9, wherein said plurality of bitlines comprises pairs of complementary bitlines, wherein a first one of said pairs of bitlines is selectably coupled to said input and said output of said pulse generator, and wherein said another one of said pairs is connected to a control circuit for holding a state of other one of said pairs of bitlines, whereby said other one of said pair corresponding to said selected bitline is held in a precharge state, whereby a read state of said storage cell does not change during operation of said ring oscillator.

14. A test system, comprising a processor for executing program instructions and coupled to a memory for storing the program instructions, wherein the processor is further coupled to an interface that couples the test system to a test memory circuit on a wafer, wherein the program instructions are program instructions for controlling the test memory circuit to measure read strength in a storage circuit, wherein the program instructions comprise program instructions for:
    first operating the interface to initiate oscillation by a ring oscillator within the test memory circuit and having a node coupled to a bitline that is connected to a storage cell of the test memory circuit with the storage cell enabled;
    first measuring a first frequency of oscillation of the ring oscillator during the first operating;
    second operating the interface to initiate oscillation by the ring oscillator with said storage cell disabled;
    second measuring a second frequency of oscillation of the ring oscillator during the second operating step; and
    computing an indication of a read strength of said storage cell in conformity with a difference between said first frequency of oscillation and said second frequency of oscillation.

15. The test system of claim 14, wherein the program instructions further comprise program instructions for:

controlling a current applied to the bitline by the second operating in response to a result of the second measuring until the second frequency of oscillation is equal to the first frequency of oscillation; and determining a read current of the storage cell from a value of the controlled current at which the second frequency of oscillation is equal to the first frequency of oscillation.

16. The test system of claim 15, wherein the program instructions further comprise program instructions for measuring the current and wherein the determining a read current is performed in conformity with a result of said measuring.

17. The test system of claim 16, wherein the program instructions further comprise program instructions for:

third operating the interface to initiate oscillation by the ring oscillator with the storage cell disabled and another storage cell enabled, wherein the other storage cell is connected to the bitline; and third measuring another frequency of oscillation of the ring oscillator during the third operating, and wherein said program instructions for determining further determine a variation in said read strength between said storage cell and said other storage cell from a difference between said first frequency of oscillation and said third frequency of oscillation.

18. The test system of claim 14, wherein the test memory circuit comprises a pulse stretcher for stretching a width of a pulse portion corresponding to said read current, whereby said first frequency of oscillation remains substantially constant.

19. The test system of claim 14, wherein said first frequency of oscillation increases dynamically as said read current shortens a pulse width of said ring oscillator, and wherein said measuring comprises reading a result from a frequency counter that counts a number of pulses of said ring oscillator prior to said first frequency of oscillation exceeding a threshold.

20. The test system of claim 14, further comprising program instructions for selecting said bitline from among a plurality of bitlines by operating the interface to enable a selected first one of a first plurality of switches within the test memory circuit that selectably couple the bitlines to the input of the pulse generator and enabling a selected second one of a second plurality of switches that selectably couple the bitlines to the output of the pulse generator.

* * * * *